(12) United States Patent
Törmänen et al.

(10) Patent No.: US 10,644,728 B2
(45) Date of Patent: May 5, 2020

(54) ANALOG PROCESSING SYSTEM FOR MASSIVE-MIMO

(71) Applicant: Beammwave AB, Södra Sandby (SE)

(72) Inventors: Markus Törmänen, Södra Sandby (SE); Per-Olof Brandt, Lomma (SE)

(73) Assignee: BEAMMWAVE AB, Sodra Sandby (SE)

( * ) Notice: Subject to any disclaimer, the term of this patent is extended or adjusted under 35 U.S.C. 154(b) by 0 days.

(21) Appl. No.: 16/290,879

(22) Filed: Mar. 2, 2019

(65) Prior Publication Data

US 2019/0199380 A1 Jun. 27, 2019

Related U.S. Application Data

(63) Continuation of application No. 15/747,395, filed as application No. PCT/SE2016/050842 on Sep. 8, 2016, now Pat. No. 10,263,646.

(30) Foreign Application Priority Data

Sep. 8, 2015 (SE) ...................................... 1551147

(51) Int. Cl.
*H04B 1/00* (2006.01)
*H04B 1/38* (2015.01)
(Continued)

(52) U.S. Cl.
CPC ........... *H04B 1/0032* (2013.01); *H01L 23/66* (2013.01); *H04B 1/38* (2013.01); *H04B 1/40* (2013.01);
(Continued)

(58) Field of Classification Search
CPC ...... H04B 1/0032; H04B 1/48; H04B 7/0413; H04B 1/40; H04B 1/38; H04B 2001/0408;
(Continued)

(56) References Cited

U.S. PATENT DOCUMENTS

| 8,554,136 B2 | 10/2013 | McCormack |
| 2005/0113035 A1* | 5/2005 | Kyongyop O ........... H01Q 1/38 455/90.3 |

(Continued)

FOREIGN PATENT DOCUMENTS

| EP | 1939980 A1 | 7/2008 |
| EP | 2824705 A2 | 1/2015 |
| GB | 2517217 A | 2/2015 |

OTHER PUBLICATIONS

International Search Report from corresponding International Application No. PCT/SE2016/050842, dated Nov. 25, 2016.
(Continued)

*Primary Examiner* — Devan A Sandiford
(74) *Attorney, Agent, or Firm* — Tucker Ellis LLP

(57) ABSTRACT

A MIMO transceiver has a plurality of analog processing subsystems that each includes at least one antenna, a duplexer, at least one power amplifier, at least one mixer, an interface connectable to a baseband processing subsystem, and the MIMO transceiver has one or more analog radio frequency processing chips. Each analog processing subsystem of the plurality of analog processing subsystems is on a single one of the analog radio frequency processing chips, and each analog radio frequency processing chip comprises a metallization on at least one side of the chip and wherein the metallization comprises integration of the at least one antenna.

14 Claims, 2 Drawing Sheets

(51) Int. Cl.
  *H04B 1/40* (2015.01)
  *H04B 7/0413* (2017.01)
  *H01L 23/66* (2006.01)
  *H04B 1/48* (2006.01)
  *H04B 1/04* (2006.01)
  *H04B 1/30* (2006.01)

(52) U.S. Cl.
  CPC .............. *H04B 1/48* (2013.01); *H04B 7/0413* (2013.01); *H01L 2223/6611* (2013.01); *H01L 2223/6616* (2013.01); *H01L 2223/6644* (2013.01); *H01L 2223/6677* (2013.01); *H04B 2001/0408* (2013.01); *H04B 2001/307* (2013.01)

(58) Field of Classification Search
  CPC .............. H04B 2001/307; H01L 23/66; H01L 2223/6611; H01L 2223/6616; H01L 2223/6644; H01L 2223/6677
  See application file for complete search history.

(56) References Cited

U.S. PATENT DOCUMENTS

| | | |
|---|---|---|
| 2008/0205495 A1 | 8/2008 | Trott |
| 2009/0180466 A1 | 7/2009 | Soul |
| 2009/0289721 A1 | 11/2009 | Rajendran et al. |
| 2010/0231452 A1 | 9/2010 | Babakhani |
| 2010/0283700 A1 | 11/2010 | Rajanish |
| 2011/0134972 A1 | 6/2011 | Zhu et al. |
| 2012/0044927 A1 | 2/2012 | Pan et al. |
| 2014/0044215 A1 | 2/2014 | Mundarath et al. |
| 2014/0198013 A1 | 7/2014 | Saraswat |
| 2016/0134316 A1 | 5/2016 | Mohan et al. |
| 2016/0157784 A1 | 6/2016 | Suzuki |

OTHER PUBLICATIONS

Swindlehurst, A.L. et al., "Millimeter-Wave Massive MIMO: The Next Wireless Revolution?," IEEE Communications Magazine, vol. 52, No. 9, pp. 56-62, Sep. 2014.

International Preliminary Report on Patentability from corresponding International Application No. PCT/SE2016/050842, completed Aug. 24, 2017.

European Search Report from corresponding Application No. 16844806.6 dated May 6, 2019.

\* cited by examiner

ANALOG PROCESSING SYSTEM FOR MASSIVE-MIMO

RELATED APPLICATION DATA

This application is a continuation of U.S. patent application Ser. No. 15/747,395, filed Jan. 24, 2018, which is a national phase entry of International Patent Application No. PCT/SE2016/050842, filed Sep. 8, 2016, which claims the benefit of Swedish Patent Application No. 1551147-0, filed Sep. 8, 2015, the disclosures of which are incorporated herein by reference in their entireties.

TECHNICAL FIELD

The present invention relates generally to the field of multiple input, multiple output (MIMO) transceivers. More particularly, it relates to the partitioning and the construction of a low complexity, high performance MIMO transceiver.

BACKGROUND

With the ever increasing demand for high data rates in consumer electronics, systems are typically pushed to utilize higher frequencies in e.g. massive multiple input, multiple output (MIMO) systems.

One main limitation of using a multiple antenna architecture is the complexity and high cost of the hardware in the radio frequency (RF) section, which typically increases with an increase in the number of antennas.

The hardware of a typical MIMO transceiver is partitioned into separate blocks, wherein each block is typically put on separate chips. According to an example, digital baseband (BB) functionality is put on one chip, RF-components such as mixers on a second chip, and power amplifiers on a third chip, while the antennas may be implemented separately.

Having multiple antennas typically requires having multiple signal paths, one for each antenna, between at least some of the hardware blocks which typically results in complex and bulky implementations, especially for radio frequency signals.

In some cases, a single signal path may be used to convey multiple signals between the antenna array and the hardware blocks which typically results in tough requirements on the signal path regarding distortion and separation of the signals.

Furthermore, the scalability of the system is limited since adding, removing, or rearranging antennas results in complex and costly processes of adding, removing, or rearranging hardware blocks.

Therefore, there is a need for hardware solutions enabling utilization of MIMO systems comprising multiple antennas while keeping implementations with an as low circuit foot print as possible without affecting the performance.

SUMMARY

It should be emphasized that the term "comprises/comprising" when used in this specification denotes the presence of stated features, integers, steps, or components, but does not preclude the presence or addition of one or more other features, integers, steps, components, or groups thereof.

It is an object of some embodiments to obviate at least some of the above disadvantages and to provide alternative transceiver implementations for massive MIMO. Preferably, such alternative transceiver implementations provide less complex and/or less costly hardware solutions for massive MIMO.

It is also an object of some embodiments to provide an alternative transceiver implementation for massive MIMO with one or more of the following advantages: high scalability, low energy consumption, and capacity for a wide frequency range.

According to a first aspect this is achieved by an analog processing subsystem comprising at least one antenna, a duplexer, at least one power amplifier, at least one mixer and an interface connectable to a baseband processing subsystem.

The at least one mixer is adapted to down-convert and inphase/quadrature—IQ—demodulate a received analog radio frequency signal, received by the at least one antenna, in order to provide a received analog baseband signal. The at least one mixer is also adapted to IQ-modulate and up-convert a transmit analog baseband signal, to be transmitted by the at least one antenna, in order to provide a transmit analog radio frequency signal.

The mixer further comprises at least one input terminal connected to an input terminal of the interface for acquiring the transmit analog baseband signal, and at least one output terminal connected to an output terminal of the interface for providing the received analog baseband signal.

In some embodiments, the at least one antenna is directly connected to the duplexer, the duplexer is directly connected to the at least one power amplifier, the at least one power amplifier is directly connected to the at least one mixer and the at least one mixer is directly connected to the interface.

Thus, a MIMO transceiver having the system according to the first aspect will be made up of several analog processing subsystems. In some embodiments, each antenna will have its own subsystem. This simplifies implementation and scalability since it is only a question of removing or adding entire subsystems. It is also cost efficient since the entire subsystem may be commercially mass produced.

In some embodiments, the subsystem consists of one antenna only.

In some embodiments, the mixer is integrated with a power amplifier process.

In some embodiments, the power amplifier process is at least one of a process for gallium-arsenide pseudomorphic high electron mobility transistors—PHEMT-GaAs, a process for gallium-arsenide heterojunction bipolar transistor GaAs-HBT, a process for silicon-germanium bipolar complementary metal oxide semiconductor—SiGe Bi-CMOS, a process for silicon on insulator—SOI, a process for fully depleted SOI—FDSOI, and a process for Si-CMOS.

In some embodiments, the analog processing subsystem is comprised on a single analog radio frequency processing chip.

In some embodiments, the analog radio frequency processing chip comprises a metallization on at least one side of the chip and the metallization comprises integration of the at least one antenna.

In some embodiments, the metallization forms an antenna structure integrated with bond wires.

In some embodiments, the antenna structure is provided on a first side of the analogue radio frequency processing chip, wherein the first side is a circuit side of the analogue radio frequency processing chip.

In some embodiments, the antenna structure is provided on a second side of the analogue radio frequency processing chip, wherein the second side is opposite to the circuit side of the analogue radio frequency processing chip.

In some embodiments, the antenna structure is adapted to isolate the analog processing system from radiation.

In some embodiments, the antenna structure is adapted to operate as a connector to a wave guide.

In some embodiments, the analog processing subsystem is suitable for being comprised in a plurality of analog processing subsystems of a multiple input, multiple output—MIMO—transceiver. The transceiver is further adapted to transmit and receive MIMO signals.

In some embodiments the analog processing subsystem is adapted to process a signal component of the MIMO signals.

In some embodiments, the analog processing subsystem is adapted to being comprised in a plurality of analog processing subsystems of a multiple input, multiple output—MIMO—transceiver. The transceiver is further adapted to transmit and receive MIMO signals and the analog processing subsystem is adapted to process a signal component of the MIMO signals.

A second aspect is an arrangement comprising a plurality of analog processing subsystems according to the first aspect operatively connected to at least one baseband processing subsystem. The baseband processing subsystem further comprises at least one analog to digital converter—ADC—configured to convert the received analog baseband signal into a received digital signal.

In some embodiments, the baseband processing subsystem further comprises at least one digital to analog converter—DAC—configured to convert a transmit digital signal into the transmit analog baseband signal. The baseband processing subsystem is further configured to provide the transmit analog baseband signal to the analog processing chip.

In some embodiments, the baseband processing subsystem is comprised on a baseband processing chip.

In some embodiments, the arrangement is a multiple input multiple output—MIMO—transceiver arrangement.

In some embodiments, the plurality of analog processing subsystems comprises a first number of analog processing subsystems. The at least one baseband processing subsystem may comprise a second number of baseband processing subsystems. The first number exceeds the second number.

A third aspect is a wireless communication device comprising the analog processing subsystem according to the first aspect or the arrangement according to the second aspect.

In some embodiments, the wireless communication device is a mobile communication device.

In some embodiments, the second and third aspects may additionally have features identical with or corresponding to any of the various features as explained above for the first aspect.

An advantage of some embodiments is that large MIMO transceivers may be enabled having high performance and low complexity. For example, there is typically one radio frequency signal path for each antenna according to some implementations of a MIMO transceiver, and the signals from several antennas are combined into a single signal path only at baseband.

Another advantage of some embodiments is that the partitioning of all components does not require the antenna and the filters to be on separate units. This further reduces the complexity of the MIMO transceiver.

Another advantage of some embodiments is that the partitioning of the components does not require a separate receiver (Rx) and transmitter (Tx) which reduces the complexity of the MIMO transceiver even further.

Another advantage of some embodiments is cost efficient implementation of MIMO systems is enabled.

Another advantage of some embodiments is that scalability of MIMO transceivers is simplified. Thus, a flexible way to construct MIMO transceivers is provided.

Another advantage of some embodiments is that chosen parts of a MIMO transceiver may be disconnected in order to reduce power consumption of the transceiver and/or interference between signals.

Another advantage of some embodiments is that massive MIMO may provide higher data rates at lower power consumption.

Another advantage of some embodiments is that there is only one or a few numbers of antennas in each signal path, resulting in simplified implementation of MIMO transceivers.

Another advantage of some embodiments is that the antenna structure and partitioning of the components can prevent leakage of interferences, resulting in a more stable, robust and reliable MIMO transceiver.

Another advantage of some embodiments is that the partitioning of the components in conjunction with the antenna structure allows the entire analog processing system to be arranged inside a wave connector, thus reducing the energy losses in MIMO transceiver in comparison to conventional usage of a wave connector, while also providing a less complex arrangement.

BRIEF DESCRIPTION OF THE DRAWINGS

Further objects, features and advantages will appear from the following detailed description of embodiments, with reference being made to the accompanying drawings, in which.

DETAILED DESCRIPTION

In the following, embodiments will be described where low cost, low complexity front ends for multiple input, multiple output (MIMO) applications are provided.

By partitioning functional units of a MIMO transceiver in any of the ways described herein, one or more advantages may be achieved as will be explained in the following.

Figure 1:
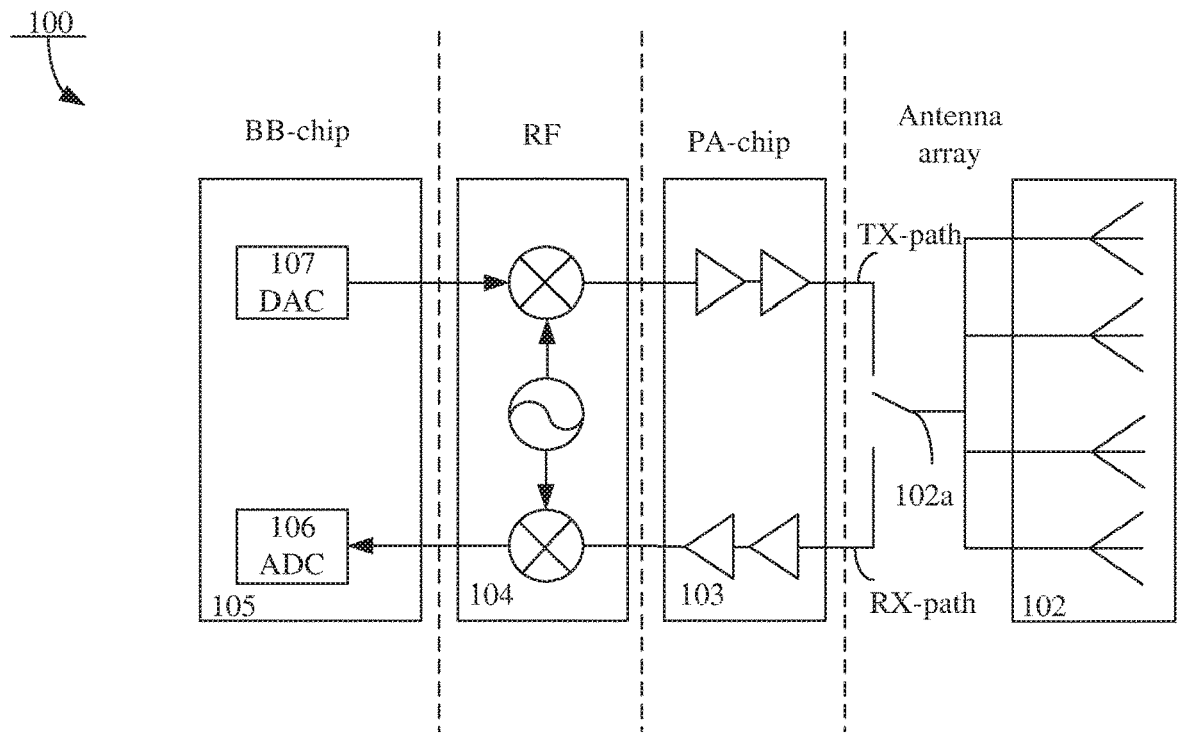
FIG. 1 is a schematic drawing illustrating an example arrangement according to prior art.

FIG. 1 illustrates an example arrangement 100 of a MIMO front end according to prior art. Arrangement 100 comprises a digital base band chip (BB-chip) 105, a radio frequency part (RF) 104, a power amplifier chip (PA-chip) 103 and an antenna array 102.

Antenna array 102 is operatively connectable to PA-ship 103 by a duplexer 102a. Duplexer 102a facilitates transition between sending and transmission of data from antenna array 102 by separating received signals and signals for transmission in e.g. the time domain or frequency domain.

A signal may typically be received by antenna array 102, the received signal is then transmitted through duplexer 102a where it is separated in order to follow a receive path (RX-path) on arrangement 100. The received signal is then transmitted to PA-chip 103 where it may pass through a low noise amplifier (LNA).

PA-chip 103 may comprise a plurality of power amplifiers (PA) and LNAs.

The PA-chip 103 is operatively connectable to RF-part 104. The received signal may typically be of low power and low voltage and the LNA may typically amplify the received signal before it is transmitted to the RF-part 104.

RF-part 104 may comprise different RF components such as an impedance matching circuit (not shown), filters (not shown), RF amplifiers (not shown), in phase/quadrature (IQ) modulators (not shown), a local oscillator and mixers.

The received signal may be demodulated by the IQ-demodulator. The frequency of the received signal, which typically is high, is then converted into a lower frequency by the mixer.

The RF-part 104 is operatively connectable to the BB-chip 105 comprising at least one analog to digital converter, ADC 106 and at least one digital to analog converter, DAC 107. The BB-chip is configured to digitize the received analog signal. The BB-chip is also configured to transform a digital signal into an analog signal for transmission.

The signal for transmission typically follows a transmission path from the BB-chip to the RF-part where the typically low frequency of the transmission signal is up-converted by the mixer. The transmission signal may also be modulated by the IQ-modulator before it is passed on to the PA-chip 103, where it is amplified by the power amplifier. The transmission signal is then passed through duplexer 102a where it is directed to the antenna array 102. The transmission signal is then transmitted by one or more antennas to a recipient device.

As illustrated in FIG. 1, the digital baseband is typically implemented in a first chip, the RF is typically implemented in a second chip, the power amplifier(s) is typically implemented in a third and the antenna array is typically implemented in a unit of its own. The PA-chip 103 and the duplexer 102a may sometimes be termed a front-end-module (FEM).

MIMO systems may comprise several antennas, e.g. 16-100 antennas. Having multiple antennas allows for multiple path reception and transmission. In order for beam forming to function properly, each antenna path typically requires a separate IQ-modulator.

Implementing an IQ-path for each of a large number of antennas is difficult in existing systems, which results in a limitation of number of antennas in the antenna array.

Since MIMO technology implementing multiple antennas is still relatively new, the traditional way of implanting the MIMO system has up until now been sufficient. Implementing MIMO according to current standard will lead to bulky implementations, however, the amount of antennas in commercial products intended for incorporation into devices with relatively small dimension (e.g. handheld consumer products) has just not been so large that the implementations have become too bulky. There has thus not been any reason to try and develop other ways of implementing MIMO systems comprising multiple antennas.

Furthermore, there is a long tradition in the field of transceiver implementation to design the baseband processing parts, the antenna parts and the radio frequency processing parts separately. This leads to that it is natural for the skilled person, or rather a team of skilled persons—skilled in respectively antenna design, radio frequency processing design and baseband processing parts—when designing a MIMO transceiver to separately design a MIMO antenna array, a radio frequency processing unit for MIMO and a baseband processing unit for MIMO and then connect these designs to each other to form a MIMO transceiver.

The inventors have, after insightful reasoning, realized that by partitioning the functional units of the existing architecture of a MIMO transceiver in another way, it is possible to enable less complex, cheaper, and/or more flexible implementations of transceiver systems comprising a high number of antennas.

Instead of having an antenna array connected via a duplexer to an amplifier chip via a mixer chip to a baseband processing chip, embodiments described herein implements—in one front end unit, e.g. a chip—a separate collection of amplifier(s) and mixer(s) for each antenna (or small collection of antennas) of the large collection of antennas making up an antenna array of a MIMO transceiver.

Several such front end units may then be freely combined to make up the front end portion of a MIMO system, which front end portion may then be connected to a baseband processing unit.

A very flexible way to construct a MIMO system is provided, since rearrangement, addition, removal of antennas are easily achieved by rearrangement, addition, removal of the entire corresponding front end units, and no (or very little further hardware adjustment is needed). Hence, scalability is improved.

Furthermore, if a MIMO construction is currently not using all antennas of its antenna array, the corresponding front end units may be easily turned off or put in a low power mode which is typically not possible, or at least cumbersome, in solutions according to the prior art.

Figure 2:
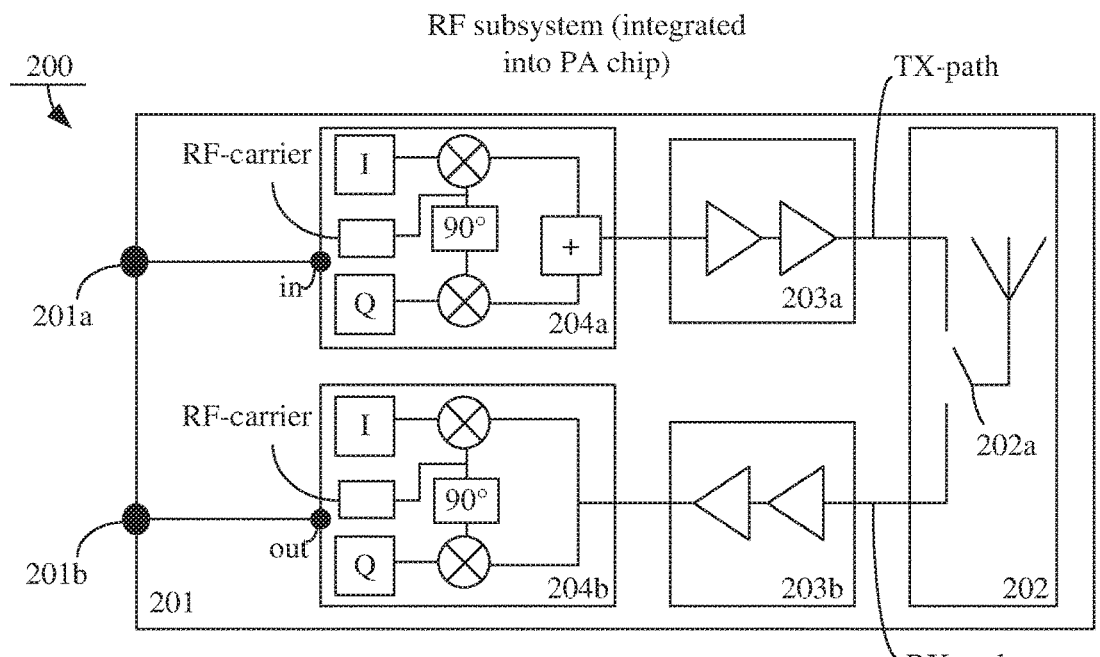
FIG. 2 is a schematic drawing illustrating an example arrangement according to some embodiments.

FIG. 2 illustrates an example arrangement 200 according to some embodiments of the invention.

Example arrangement 200 comprises a chip 201 which in turn comprises an antenna 202, power amplifiers 203a, 203b, and RF mixer and modulation part 204a, 204b, also denoted as RF-part 204a, 204b.

In some embodiments, the modulation or demodulation of the RF-part 204a and 204b may be done through in-phase/quadrature (IQ) modulation/demodulation.

In some embodiments, the antenna 202 comprises one antenna. In some embodiments, the antenna 202 may comprise more than one antenna, while still not comprising all of the antennas making up a massive-MIMO system. For example, the antenna 202 may comprise two, three or four antennas.

In some embodiments the at least one antenna consists of one antenna only, which results in a less complex MIMO transceiver and analog processing subsystem.

In some embodiments the at least one antenna consisting of one antenna only may have at least one feeding point.

In some embodiments, the antenna is integrated in the chip 201 by using the standard metallization of the chip, i.e. the metallization which every commercial chip is provided with. In some embodiments, the chip 201 may be provided with a custom metallization for integration of the antenna. Such custom metallization may e.g. be provided on a first side of the chip 201 (such as the circuit side, or top side) or on a second side of the chip (such as the back side of the chip) connected with silicon through vias.

As a result of providing the antenna on the chip 201 a conventional separate antenna unit is not required, thus an analog processing subsystem of lesser complexity can be achieved.

In some embodiments, the antenna is integrated by using e.g. bond wires (or any other suitable connecting technology) where the metallization forms an antenna structure.

In some embodiments, the antenna structure may be provided on a second side of the chip 201. The second side of the chip 201 may be opposite to the circuit side of the chip 201.

In some embodiments, the metallization forming the antenna structure may also be adapted to isolate the RF-transmission circuit from radiation. According to said some embodiments the antenna structure may be directly connected to the analog processing subsystem, i.e. the circuitry of the analog processing subsystem and a ground point. Accordingly, the antenna structure may comprise of at least one grounded connection. Hence, interferences can be prevented from leaking out from the analog processing subsystem, thus a more robust and stable subsystem can be achieved.

In some embodiments, the antenna structure formed by the metallization may be adapted to operate as a connector to a wave guide. In such an embodiment the antenna structure and the chip 201 may be adapted to be arranged inside a wave connector. The chip 201 may be adapted to be arranged inside the wave connector with at least one fastening mean or a holding structure, either directly to the wave connector itself or an intermediate fastening part connected to the wave connector. Said wave connector may be a pipe, preferably a metallic pipe such as a metallic pipe with a rectangular or circular cross section. Thus, the radio wave propagation from the entire chip will take place inside an open metal object hindering the wave propagation in at least one dimension, leading to less energy losses and a more robust, efficient and reliable system.

The antenna 202 may comprise or be connected to a duplexer 202a which may switch or otherwise separate between a transmit path (TX-path) and a receive path (RX-path). The TX-path comprises TX-power amplifier 203a and TX-RF-part 204a. The RX-path comprises RX-power amplifier 203b, and RX-RF-part 204b.

In some embodiments, the RX-power amplifier 203b may be a LNA.

The mixer of RF-part 204a, 204b comprises at least one input terminal (in) connected to an input terminal 201a of the chip 201, and at least one output terminal (out) connected to an output terminal 201b of the chip 201.

According to some embodiments, a typical scenario is a signal being received by antenna 202. The duplexer 202a may separate the received signal from transmission signals e.g. by phasing or phase shifting of the received signal, or in any other suitable way, so that it is steered to the RX-path. The received signal is then passed to the RX-power amplifier 203b which amplifies the received signal, which is typically of low power and low voltage, while keeping noise of the received signal to a minimum. The received signal may e.g. be subjected to added random noise from the antenna 202.

The amplified received signal is then passed through the RX-RF-part 204b of the chip 201.

In RX-RF-part 204b, the received signal is demodulated by the IQ-demodulator. The received signal is typically of high frequency, which frequency is down-converted by the mixer in RX-RF-part 204b. The demodulated and down-converted received signal is then transmitted to the output terminal (out) of the RX-RF-part 204b which is connected to the output terminal 201b of the chip 201.

In some embodiments the chip 201 may be a radio frequency processing chip. In some embodiments, the chip 201 is a RF-subsystem.

In some embodiments, if a signal is to be transmitted from the chip 201, a transmit signal is received at the input terminal 201a of the chip 201. The transmit signal is forwarded through input terminal (in) to TX-RF-part 204a.

In TX-RF-part 204a the transmit signal is modulated by IQ-modulator and the frequency of the transmit signal is up-converted by the mixer.

From the mixers the transmit signal is passed to TX-power amplifier 203a which amplifies the transmit signal.

The transmit signal is then separated from received signals by the duplexer 202a and transmitted by antenna 202.

Although it may seem in FIG. 2 that antenna array 202, power amplifiers 203a, 203b and RF parts 204a, 204b are all in separate parts, it should be noted that this is only illustrated such for sake of clarity. The different parts may all be integrated onto the single chip 201.

The at least one antenna 202 may be directly connected to the duplexer 202a, which in turn may be directly connected the at least one power amplifier 203a, 203b. The at least one power amplifier may accordingly be directly connected to the at least one mixer 204a, 204b which may be connected to the interface.

With above mentioned arrangement an integration of the analog processing system onto one chip 201 is enabled. Furthermore, contrary to conventional analog processing subsystems it does not require a separation of Tx and Rx which typically adds to the complexity of the conventional systems.

Said arrangement of above mentioned components in conjunction with the antenna being integrated onto the chip 201 allows for all of the functionality of the analog processing subsystem to be integrated onto one chip 201. Accordingly, the partitioning of the components allows for a analog processing subsystem more suitable for combining into a large MIMO transceiver due to the reduced complexity and increased modularity.

In order to simplify the implementation, power amplifiers, RF components, and antennas are integrated into one chip or subsystem (the terms may be used interchangeably in this disclosure). The IQ-modulator and demodulator of the RF part are well suited to being integrated in the relatively advanced power amplifier processes.

Such advances processes are e.g. gallium-arsenide pseudomorphic high electron mobility transistors (PHEMT-GaAs), gallium-arsenide heterojunction bipolar transistor GaAs HBT, specialized Silicon processes like silicon-germanium bipolar complementary metal oxide semiconductor (SiGe Bi-CMOS), silicon on insulator (SOI), and fully depleted SOI (FDSOI).

These processes may be expensive to implement compared to Silicon CMOS processes and also integration of low performance functionality like BB-filter and power management functions. These functions are big and require less complicated processes.

The advanced processes may however be advantageous to use for higher frequencies.

Thus, it is beneficial to integrate the IQ-modulator and demodulator in the power amplifier process, as compared to prior art systems, where the IQ-modulator and demodulator is integrated into the RF process. However, it is to be noted that if the performance of the transceiver is high, the implementations can go into standard CMOS processes as an alternative.

Figure 3:
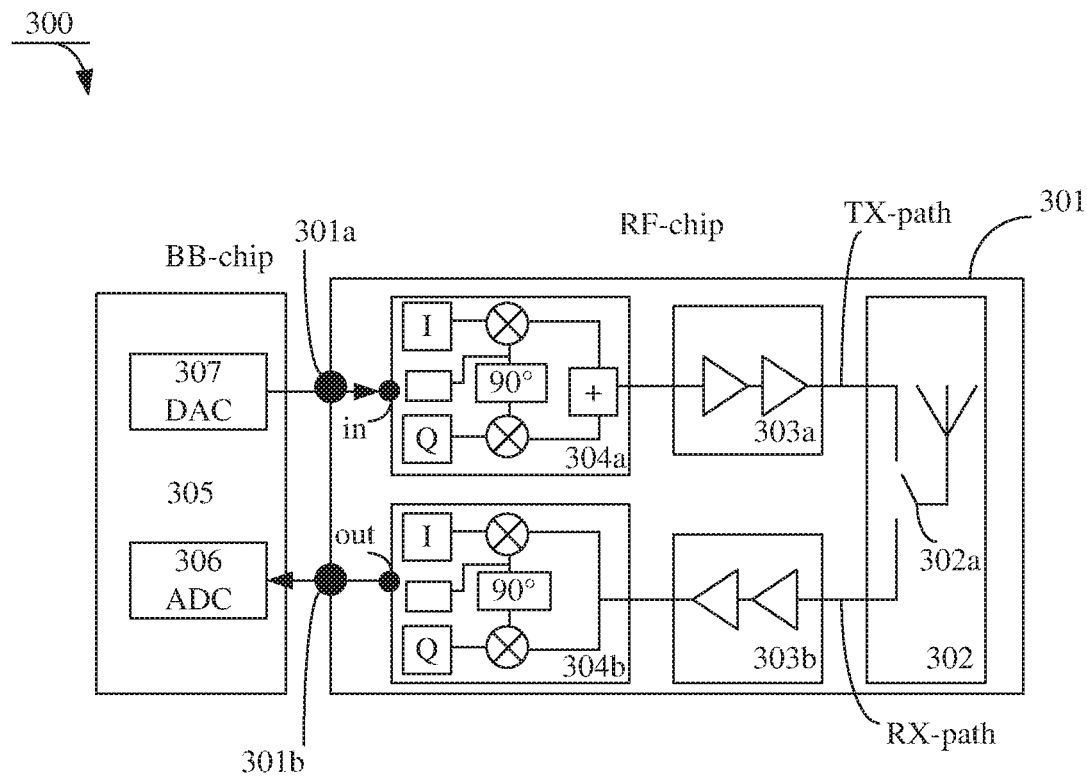
FIG. 3 is a schematic drawing illustrating an example arrangement according to some embodiments.

FIG. 3 illustrates an example arrangement 300 according to some embodiments. Example arrangement 300 comprises a RF-chip 301 operatively connected to a digital base band (BB) chip 305.

RF-chip 301 comprises an antenna 302, power amplifiers 303a, 303b, mixer and modulation (RF) part 304a, 304b. In some embodiments, RF-chip 301 and its components may be the chip 201 and/or components as described in conjunction with FIG. 2.

BB-chip 305 comprises at least one ADC 306, and at least one DAC 307 and at least one BB-processing unit(s) (not shown).

In some embodiments, the RF part 304a, 304b comprises at least one IQ-modulator and demodulator and at least one mixer.

In some embodiments, the mixer of RF-part 304a, 304b comprises at least one input terminal (in) connected to an input terminal 301a of the chip 301, and at least one output terminal (out) connected to an output terminal 301b of the chip 201.

In some embodiments, the antenna 302 comprises one antenna. In some embodiments, the antenna 302 may comprise more than one, but still a small number—such as two, antennas.

The antenna 302 may comprise or be connected to a duplexer 302a which may switch or separate between a transmit path (TX-path) and a receive path (RX-path). The TX-path comprises TX-power amplifier 303a and TX-RF-part 304a, and wherein the RX-path comprises RX-power amplifier 303b, and RX-RF-part 304b.

According to some embodiments, a typical scenario is a signal being received by antenna 302. The duplexer may separate the received signal from transmission signals by e.g. phasing or phase shifting of the received signal so that it is steered to the RX-path. The received signal is then passed to the RX-power amplifier 303b. RX-power amplifier 303b amplifies the received signal, which is typically of low power and low voltage, while keeping noise of the received signal to a minimum. The received signal may e.g. be subjected to added random noise from the antenna 302.

The amplified received signal is then transmitted through the RX-RF-part 304b of the RF chip 301.

In RX-RF-part 304b, the received signal is demodulated by the IQ-demodulator. The received signal is typically of high frequency, which frequency is down-converted by the mixer in RX-RF-part 304b. The demodulated and down-converted received signal is then passed to the output terminal (out) of the RX-RF-part 304b, which output terminal (out) is connected to the output terminal 301b of the RF-chip 301.

The received signal may then continue the RX-path from the output terminal 301b to BB-chip 305 and ADC 306, wherein the received signal is converted into a digital signal.

The TX-path may begin in the BB-chip 305 wherein DAC 307 converts a digital signal into an analog transmit signal and forwards it along the TX-path through the input terminal 301a of the RF-chip, which input terminal 301a is connected to the input terminal (in) of the TX-RF part 304a.

In TX-RF part 304a the transmit signal is modulated and up-converted by the IQ-modulator and mixer.

The transmit signal is then passed to and amplified by TX-power amplifier 303a before being separated from incoming received signals in the duplexer 302a. The transmit signal is then transmitted by antenna 302.

By connecting one or several RF-chips or subsystems, such as chip 201 or 301 as described in conjunction with FIGS. 2 and 3, to one or more digital BB-chip complex arrays of massive MIMO-systems having high performance may be enabled.

In some embodiments, a plurality of processing subsystems may form part of a MIMO-transceiver which may be adapted to transmit and receive MIMO signals.

In some embodiments, the subsystem may further be adapted to process a signal component of the MIMO signals.

Figure 4:
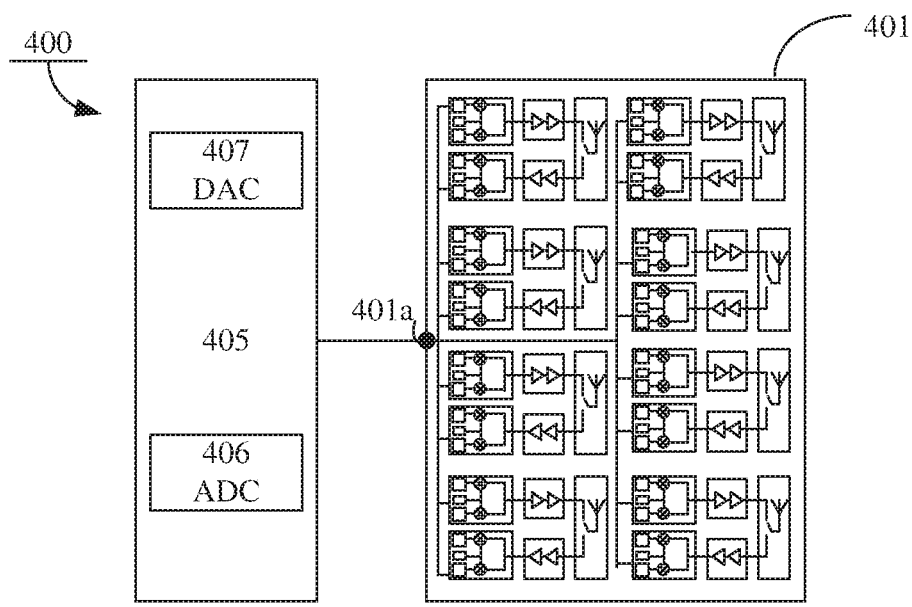
FIG. 4 is a schematic drawing illustrating an example arrangement according to some embodiments.

FIG. 4 illustrates an example arrangement according to some embodiments, wherein several RF subsystems comprised on one chip 401 are operatively connected to one digital BB-chip 405.

In some embodiments, several subsystems comprised on individual chips, such as chip 201 and 301 of FIGS. 2 and 3, may be operatively connected into a single system.

Each of the RF subsystems may for example be the chip 301 or 201 as described in conjunction with FIGS. 2 and 3.

The digital BB-chip may for example be the digital BB-chip 305 as described in conjunction with FIG. 3.

Each RF subsystem comprises a signal path which may in some embodiments be connected to a joint output terminal 401a of the chip 401.

In some embodiments, the joint output terminal 401a may also be an input terminal. In some embodiments, chip 401 may comprise at least one output terminal 401a and at least one input terminal.

In some embodiments, each signal path of the RF-subsystems may be connected to an individual output, and/or input, terminal comprised on the chip 401.

Typically in prior art, the power amplifiers are designed in a high performance process in order to maximize performance and power consumption. The RF-parts are typically designed in an intermediate CMOS process whereas the BB is designed in the latest available CMOS process technology. This portioning is typically complicated and expensive to implement.

The architecture of the RF-subsystem is thus also cost effective since similar integration processes such as integrating power amplifiers and IQ-modulators may be carried out in the same integration process.

Having multiple RF-subsystems according to some embodiments with individual signal paths also enables improved scalability over prior art. There is furthermore an increased flexibility as the architecture of the chip 401 may easily be changed by adding or removing RF subsystems.

In some embodiments, the RF subsystems may also be arranged in clusters, or they may be spread out on the chip 401.

According to some embodiments, the multiple RF subsystems may enable complex MIMO systems as several transceiver antennas may be implemented on a single chip. The RF subsystems may be positioned so that interference between different signals may be kept to a minimum.

In some embodiments, one or more of the RF-subsystems may be shut off or otherwise disconnected in order to reduce power consumption of the transceiver and/or mitigate interference between signals.

Furthermore, an interface between the BB-chip 405 and the chip 401 is of low frequency since a received signal is down converted before entering the BB-chip 405, and a transmit signal is up converted after leaving the BB-chip 405. A low frequency interface further enables the use of multiple antennas receiving or transmitting signals since the signals require less frequency bandwidth.

Embodiments may appear within an electronic apparatus (such as a wireless communication device) comprising circuitry/logic according to any of the embodiments. The electronic apparatus may, for example, be a portable or handheld mobile radio communication equipment, a mobile radio terminal, a mobile telephone, a base station, a communicator, an electronic organizer, a smartphone, a computer, a notebook, or a mobile gaming device.

Reference has been made herein to various embodiments. However, a person skilled in the art would recognize numerous variations to the described embodiments that would still fall within the scope of the claims.

E.g. it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

The invention claimed is:

1. A multiple input multiple output (MIMO) transceiver arrangement comprising a plurality of removable analog processing subsystems operatively connected to at least one baseband processing subsystem, and one or more analog radio frequency processing chips,
   wherein the plurality of analog processing subsystems comprises a first number of analog processing subsystems, wherein the at least one baseband processing subsystem comprises a second number of baseband processing subsystems, and wherein the first number exceeds the second number,
   each analog processing subsystem comprising at least one antenna, a duplexer, at least one power amplifier, at least one mixer and an interface connectable to a baseband processing subsystem,
   wherein the at least one mixer is adapted to down-convert and inphase/quadrature (IQ) demodulate a received analog radio frequency signal, received by the at least one antenna, to provide a received analog baseband signal and to IQ-modulate and up-convert a transmit analog baseband signal, to be transmitted by the at least one antenna, to provide a transmit analog radio frequency signal,
   wherein the mixer comprises at least one input terminal connected to an input terminal of the interface for acquiring the transmit analog baseband signal and at least one output terminal connected to an output terminal of the interface for providing the received analog baseband signal,
   wherein the at least one antenna is directly connected to the duplexer, the duplexer is directly connected to the at least one power amplifier, the at least one power amplifier is directly connected to the at least one mixer and the at least one mixer is directly connected to the interface,
   wherein each analog processing subsystem of the plurality of analog processing subsystems is comprised on a single one of the analog radio frequency processing chips, and
   wherein each analog radio frequency processing chip comprises a metallization on at least one side of the chip and wherein the metallization comprises integration of the at least one antenna.

2. The arrangement according to claim 1, wherein the at least one antenna consists of at least one antenna only.

3. The arrangement according to claim 2, wherein the mixer and the at least one power amplifier are integrated into the single analog radio frequency processing chip with a power amplifier process.

4. The arrangement according to claim 3, wherein the power amplifier process is at least one of a process for gallium-arsenide pseudomorphic high electron mobility transistors (PHEMT-GaAs), a process for gallium-arsenide heterojunction bipolar transistor (GaAs-HBT), a process for silicon-germanium bipolar complementary metal oxide semiconductor (SiGe Bi-CMOS), a process for silicon on insulator (SOI), a process for fully depleted SOI (FDSOI), and a process for Si-CMOS.

5. The arrangement according to claim 1, wherein the metallization forms an antenna structure integrated with bond wires.

6. The arrangement according to claim 5, wherein the antenna structure is provided on a first side of the analogue radio frequency processing chip, wherein said first side is a circuit side of said chip.

7. The arrangement according to claim 5, wherein the antenna structure is provided on a second side of the analogue radio frequency processing chip, wherein said second side is opposite to a circuit side of said chip.

8. The arrangement according to claim 7, wherein the antenna structure is adapted to isolate each analog processing subsystem from radiation.

9. The arrangement according to claim 5, wherein the antenna structure is adapted to operate as a connector to a wave guide.

10. The arrangement according to claim 1, wherein the baseband processing subsystem comprises at least one analog to digital converter (ADC) configured to convert the received analog baseband signal into a received digital signal.

11. The arrangement according to claim 10, wherein the baseband processing subsystem further comprises at least one digital to analog converter (DAC) configured to convert a transmit digital signal into the transmit analog baseband signal, and wherein the baseband processing subsystem is configured to provide the transmit analog baseband signal to the analog processing chip.

12. The arrangement according to claim 1, wherein the baseband processing subsystem is comprised on a baseband processing chip.

13. A wireless communication device comprising the arrangement according to claim 1.

14. The wireless communication device according to claim 13, wherein the wireless communication device is a mobile communication device.

* * * * *